United States Patent
Itoda et al.

(10) Patent No.: US 11,515,114 B2
(45) Date of Patent: Nov. 29, 2022

(54) CONTROL CIRCUIT FOR SWITCH DEVICE, AND SWITCH DEVICE

(71) Applicant: Omron Corporation, Kyoto (JP)

(72) Inventors: Shuichi Itoda, Kusatsu (JP); Takeshi Nishida, Ibaraki (JP); Shinya Matsuo, Yamaga (JP)

(73) Assignee: Omron Corporation, Kyoto (JP)

( * ) Notice: Subject to any disclaimer, the term of this patent is extended or adjusted under 35 U.S.C. 154(b) by 757 days.

(21) Appl. No.: 16/477,960

(22) PCT Filed: Nov. 29, 2017

(86) PCT No.: PCT/JP2017/042757
§ 371 (c)(1),
(2) Date: Jul. 15, 2019

(87) PCT Pub. No.: WO2018/159041
PCT Pub. Date: Sep. 7, 2018

(65) Prior Publication Data
US 2020/0126747 A1    Apr. 23, 2020

(30) Foreign Application Priority Data

Mar. 2, 2017 (JP) .............................. JP2017-039596

(51) Int. Cl.
*H01H 50/64* (2006.01)
*H01H 50/18* (2006.01)
(Continued)

(52) U.S. Cl.
CPC ............ *H01H 50/64* (2013.01); *H01H 47/00* (2013.01); *H01H 50/18* (2013.01); *H03K 17/567* (2013.01);
(Continued)

(58) Field of Classification Search
None
See application file for complete search history.

(56) References Cited

U.S. PATENT DOCUMENTS

| 5,914,849 A | 6/1999 | Perreira |
| 2005/0200439 A1 | 9/2005 | Kawahara et al. |
(Continued)

FOREIGN PATENT DOCUMENTS

| JP | S49-65144 U | 6/1974 |
| JP | H02-106658 U | 8/1990 |
(Continued)

OTHER PUBLICATIONS

International Search Report issued in Application No. PCT/JP2017/042757, dated Feb. 20, 2018 (2 pages).
(Continued)

*Primary Examiner* — Jared Fureman
*Assistant Examiner* — Aqeel H Bukhari
(74) *Attorney, Agent, or Firm* — Osha Bergman Watanabe & Burton LLP

(57) ABSTRACT

A control circuit for a switch device including a first switch element including a movable contact and a drive coil that controls the movable contact of the first switch element, the control circuit for returning the movable contact when the drive coil turns off the movable contact after the drive coil turns on the movable contact during supply of a source voltage from a power source, the control circuit includes a second switch element inserted between a rectifier circuit or a surge absorbing element and the first switch element, the second switch element being turned off when the supply of the source voltage is turned off. The rectifier circuit or the surge absorbing element is connected between the power source and the control circuit. The first switch element is (Continued)

turned off the movable contact is returned by turning off the second switch element to turn off the first switch element.

15 Claims, 10 Drawing Sheets

(51) Int. Cl.
    *H03K 17/60*     (2006.01)
    *H03K 17/567*     (2006.01)
    *H03K 17/687*     (2006.01)
    *H01H 47/00*     (2006.01)

(52) U.S. Cl.
    CPC ........... *H03K 17/60* (2013.01); *H03K 17/687* (2013.01); *H01H 2205/002* (2013.01)

(56) References Cited

U.S. PATENT DOCUMENTS

| | | | | |
|---|---|---|---|---|
| 2013/0003246 A1* | 1/2013 | Subramaniam | ...... | H01H 47/002 361/160 |
| 2015/0092313 A1* | 4/2015 | de Haas | ................ | H01H 47/32 361/187 |
| 2015/0097375 A1 | 4/2015 | Qin et al. | | |
| 2015/0357141 A1* | 12/2015 | Chennakesavan | ..... | H01H 47/04 361/194 |
| 2015/0371799 A1* | 12/2015 | Sumino | ................ | H01H 47/002 307/96 |
| 2016/0293365 A1* | 10/2016 | Tanaka | .................. | H01F 7/1805 |
| 2018/0110112 A1* | 4/2018 | Lee | ....................... | H02J 7/0068 |

FOREIGN PATENT DOCUMENTS

| | | |
|---|---|---|
| JP | H02-106659 U | 8/1990 |
| JP | 2005-302700 A | 10/2005 |
| JP | 2016-25456 A | 2/2016 |

OTHER PUBLICATIONS

Written Opinion issued in International Application No. PCT/JP2017/042757, dated Feb. 20, 2018 (8 pages).

International Preliminary Report on Patentability issued in International Application No. PCT/JP2017/042757, dated Jan. 16, 2019 (6 pages).

* cited by examiner

CONTROL CIRCUIT FOR SWITCH DEVICE, AND SWITCH DEVICE

TECHNICAL FIELD

The present invention relates to a control circuit for a switch device such as an electromagnetic relay and a switch, the control circuit for decreasing attractive force during return of the switch device, and the switch device including the control circuit.

BACKGROUND ART

For example, Patent Document 1 discloses an electromagnetic contactor that brings a movable contact of a contact piece into contact with a fixed contact by movement of a guide against a return spring onto a fixed contact side in order to secure a necessary contact pressure without increasing a load of a contact spring of the electromagnetic relay. An abutting unit is provided in the electromagnetic relay. The abutting unit includes a spring auxiliary member in which spring pieces are formed at both ends. The abutting unit fixes the spring auxiliary member to the contact piece, and abuts the guide against the spring piece by the movement of the guide to bend the spring piece, thereby generating a load. At this point, the load of the spring piece is generated immediately after the movable contact comes into contact with the fixed contact, and a contact spring load of the contact spring and the load are caused to act on the contact piece as a contact pressure bringing the movable contact into contact with the fixed contact.

Patent Document 2 discloses a power decreasing control circuit using an electronic chopper. The control circuit includes a voltage correction and high-speed dropout time function by controlling a coil current to a spring bias type DC actuator supplied from a power source by a chopper circuit.

FIG. 8 is a circuit diagram illustrating a configuration example of a control circuit and a peripheral circuit for an electromagnetic relay of a conventional example. In FIG. 8, a DC power source 80 is grounded through a power switch SW and a drive coil 70C of an electromagnetic relay. A diode D70 that absorbs a surge current when the power switch SW is turned on is connected in parallel with the drive coil 70C. In FIG. 8, when the power switch SW is turned off, a back electromotive voltage is applied to the drive coil 70C, whereby a current $I_{D70}$ is passed through the drive coil 70C and the diode D70.

PRIOR ART DOCUMENTS

Patent Documents

Patent Document 1: Japanese Unexamined Patent Publication No. 2005-302700
Patent Document 2: U.S. Pat. No. 5,914,849

SUMMARY OF THE INVENTION

Problems to be Solved by the Invention

FIG. 9 is a graph illustrating operation of the control circuit for the electromagnetic relay in FIG. 8, FIG. 9(A) is a graph illustrating a time characteristic when the electromagnetic relay is returned, and FIG. 9(B) is a graph illustrating the attractive force of the electromagnetic relay corresponding to FIG. 9(A).

As is clear from FIG. 9(A), current $I_{SW}$ and current $I_{10C}$ increase when the power switch SW is turned on, and the current $I_{D70}$ is passed through the circuit including the drive coil 70C and the diode D70 as a counter electromotive current when the power switch SW is turned off. At this point, as is clear from FIG. 9(B), the attractive force generated by the counter electromotive current based on inductance of the drive coil 70C may obstruct the return operation of a movable contact in the electromagnetic relay of the drive coil 70C, which results in a problem in that the return of the movable contact of the electromagnetic relay is delayed. The same problem is generated in the drive coils of Patent Documents 1 and 2.

An object of the present invention is to provide a control circuit for a switch device, the control circuit being capable of returning the movable contact of the switch device such as the electromagnetic relay at relatively high speed as compared with the conventional technique.

Means for Solving the Problem

According to one aspect of the present invention, a control circuit for a switch device including a first switch element including a movable contact and a drive coil that controls the movable contact of the first switch element, the control circuit for returning the movable contact when the drive coil turns off the movable contact after the drive coil turns on the movable contact during supply of a source voltage from a power source, the control circuit includes a second switch element inserted between a rectifier circuit or a surge absorbing element and the first switch element, the second switch element being turned off when the supply of the source voltage is turned off. The rectifier circuit or the surge absorbing element is connected between the power source and the control circuit, and the first switch element is turned off by turning off the second switch element.

Effect of the Invention

Thus, in the control circuit for the switch device of the present invention, the movable contacts of the switch device such as the electromagnetic relay and the switch can be returned at relatively high speed as compared with the conventional technique.

BRIEF DESCRIPTION OF THE DRAWINGS

FIG. 2(A) is a graph illustrating a time characteristic of current of a drive coil 10C of the electromagnetic relay 10 when a MOS transistor Q1 in FIG. 1 is turned off, and FIG. 2(B) is a graph illustrating attractive force of the electromagnetic relay 10 corresponding to FIG. 2(A).

FIG. 9(A) is a graph illustrating the time characteristic when the electromagnetic relay is returned, and FIG. 9(B) is a graph illustrating the attractive force of the electromagnetic relay corresponding to FIG. 9(A).

MODE FOR CARRYING OUT THE INVENTION

Figure 1A:
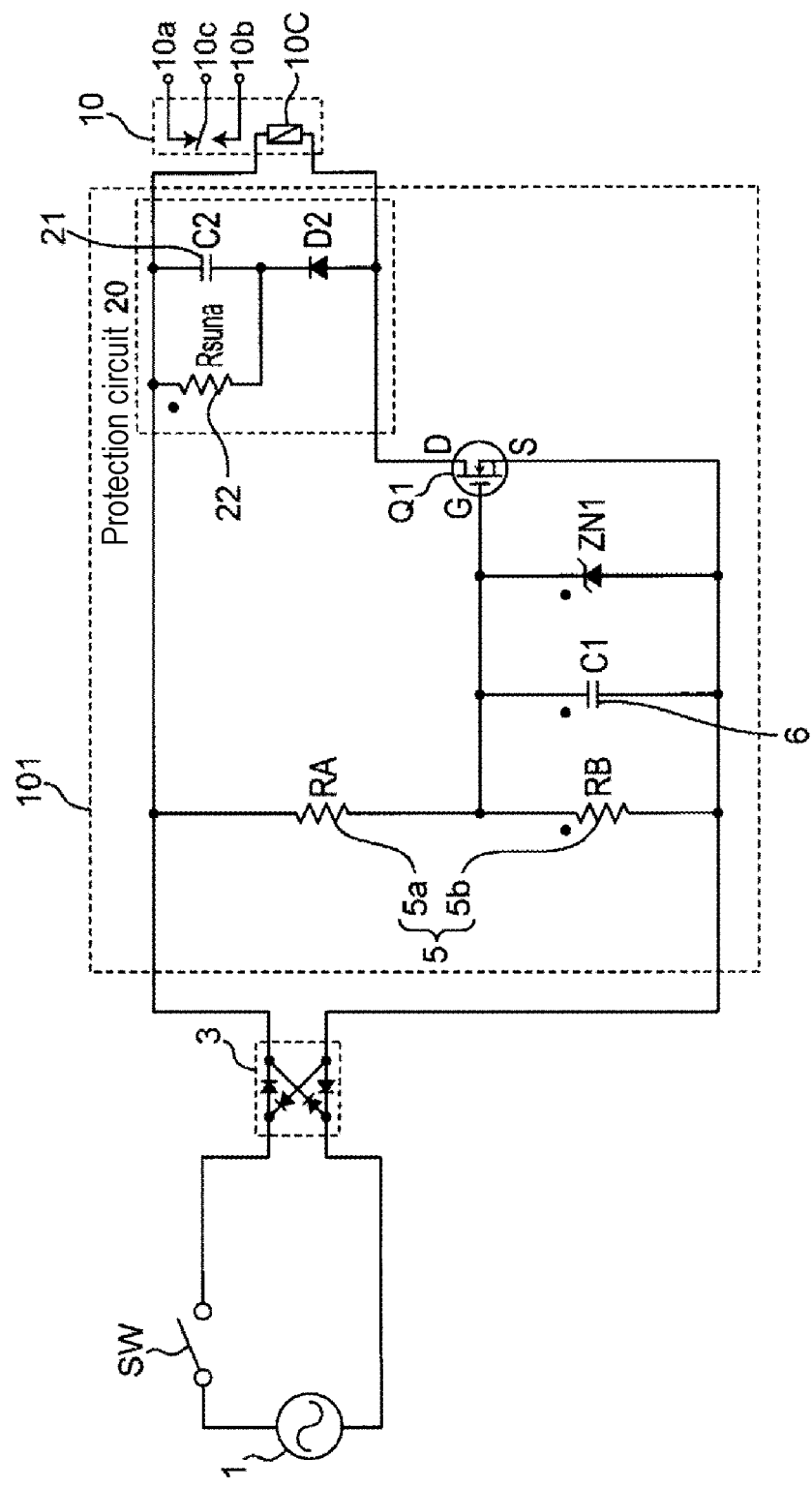
FIG. 1A is a circuit diagram illustrating a configuration example of a control circuit 101 and a peripheral circuit for an electromagnetic relay 10 according to a first embodiment of the present invention.

Hereinafter, embodiments of the present invention will be described with reference to the drawings. In the following embodiments, the same component is denoted by the same reference numeral.

First Embodiment

FIG. 1A is a circuit diagram illustrating a configuration example of a control circuit 101 and a peripheral circuit for an electromagnetic relay 10 according to a first embodiment of the present invention.

In FIG. 1A, the control circuit 101 and the peripheral circuit for an electromagnetic relay 10 include an AC power source, a power switch SW, a diode bridge circuit 3 which is a rectifier circuit, the electromagnetic relay 10, and the control circuit 101. The electromagnetic relay 10 includes fixed contacts 10a, 10b, a movable contact 10c, and a drive coil 10C of an inductance Ld. The control circuit 101 includes a voltage divider circuit 5 including a voltage divider resistor 5a having a resistance value RA and a voltage divider resistor 5b having a resistance value RB, a capacitor 6 having a capacitance value C1, a Zener diode ZN1, a MOS transistor Q1, and a protection circuit 20. The protection circuit 20 includes a snubber circuit including a resistor 22 having a resistance value Rsuna and a capacitor 21 having a capacitance value C2, and a surge current absorbing diode D2.

An AC voltage generated by the AC power source 1 is input to the diode bridge circuit 3 through the power switch SW. The diode bridge circuit 3 performs full-wave rectification on the inputted AC voltage, and the rectified pulsating flow voltage is input to both ends of the drive coil 10C of the electromagnetic relay 10 through the voltage divider circuit 5 and a series circuit of the protection circuit 20 and the MOS transistor Q1. The voltage divider circuit 5 divides the applied voltage into divided voltages using two voltage divider resistors 5a, 5b, and the divided voltages are applied to a gate of the MOS transistor Q1 through the capacitor 6 and the Zener diode ZN1. At this point, the Zener diode ZN1 is provided in order to turn on the MOS transistor Q1 at a predetermined constant voltage. One end of the diode bridge circuit 3 is connected to one end of the drive coil 10C through one end of the voltage divider circuit 5 and one end of the protection circuit 20, and the other end of the diode bridge circuit 3 is connected to a source of the MOS transistor Q1 through the other end of the voltage divider circuit 5. A drain of the MOS transistor Q1 is connected to the other end of the drive coil 10C through the other end of the protection circuit 20.

Figure 2:
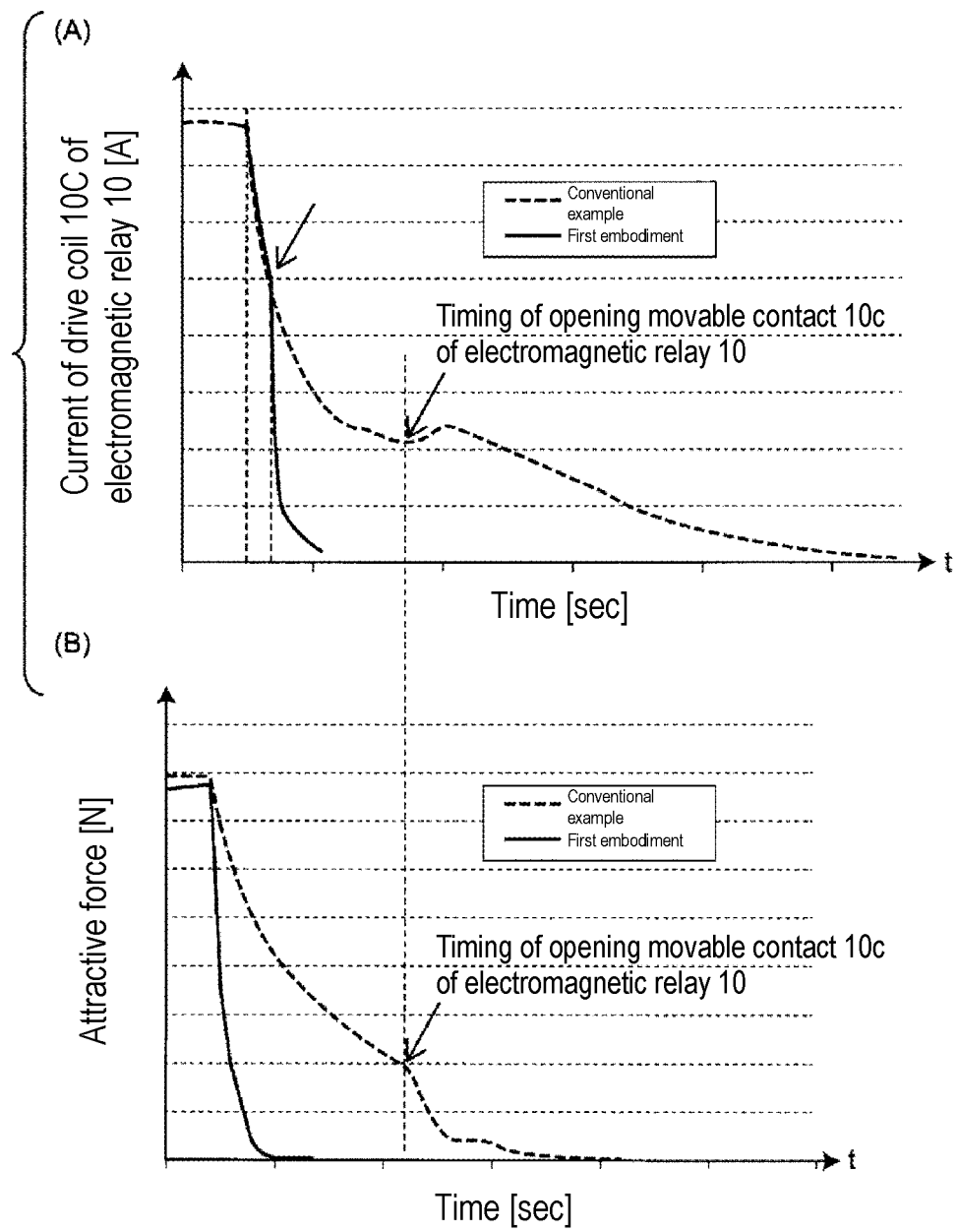
FIG. 2 is a graph illustrating operations of the control circuits for the electromagnetic relay 10 according to the conventional example and the first embodiment.

FIG. 2 is a graph illustrating operations of the control circuits for the electromagnetic relay 10 according to the conventional example and the first embodiment, FIG. 2(A) is a graph illustrating a time characteristic of current of the drive coil 10C of the electromagnetic relay 10 when the MOS transistor Q1 in FIG. 1A is turned off, and FIG. 2(B) is a graph illustrating attractive force of the electromagnetic relay 10 corresponding to FIG. 2(A).

In the control circuit 101 configured as described above, when the power switch SW is turned off, the MOS transistor Q1 is turned off, and the movable contact 10c of the electromagnetic relay 10 is connected to the fixed contact 10a. When the power switch SW is turned on, the MOS transistor Q1 is turned on, and the movable contact 10c of the electromagnetic relay 10 is switched from the fixed contact 10a to the fixed contact 10b, and turned on. When the power switch SW is turned off, the current of the drive coil 10C is decreased as illustrated in FIG. 2(A). At this point, first, the MOS transistor Q1 is turned off, and the current of the drive coil 10C is decreased at higher speed as compared with the conventional technique, whereby the attractive force of the drive coil 10C is also decreased at higher speed as illustrated in FIG. 2(B). Subsequently, the movable contact 10c of the electromagnetic relay 10 is switched from the fixed contact 10b to the fixed contact 10a, and turned off. Thus, the movable contact 10c of the electromagnetic relay 10 can be returned at higher speed as compared with the conventional technique.

In the first embodiment, a level of a gate-source voltage of the MOS transistor Q1 can be changed by changing the resistance values RA, RB of the voltage divider resistors 5a, 5b that divide the source voltage. Consequently, on and off timing of the MOS transistor Q1 can freely be adjusted, so that a return voltage can be adjusted at a place except for design of the electromagnet of the electromagnetic relay 10.

In the first embodiment, surge resistance of the MOS transistor Q1 can be improved by connecting the protection circuit 20 in parallel with the drive coil 10C. A return speed of the iron piece and the contact of the electromagnet of the electromagnetic relay 10 can be controlled by adjusting an RC time constant of the snubber circuit in the protection circuit 20.

In the first embodiment, the MOS transistor Q1 is used to decrease the attractive force during the return of the electromagnetic relay 10. However, the present invention is not limited to the first embodiment. Alternatively, a voltage control type switch element such as a MOS transistor, a bipolar transistor, and an IGBT (Insulated Gate Bipolar Transistor) may be used.

Figure 1B:
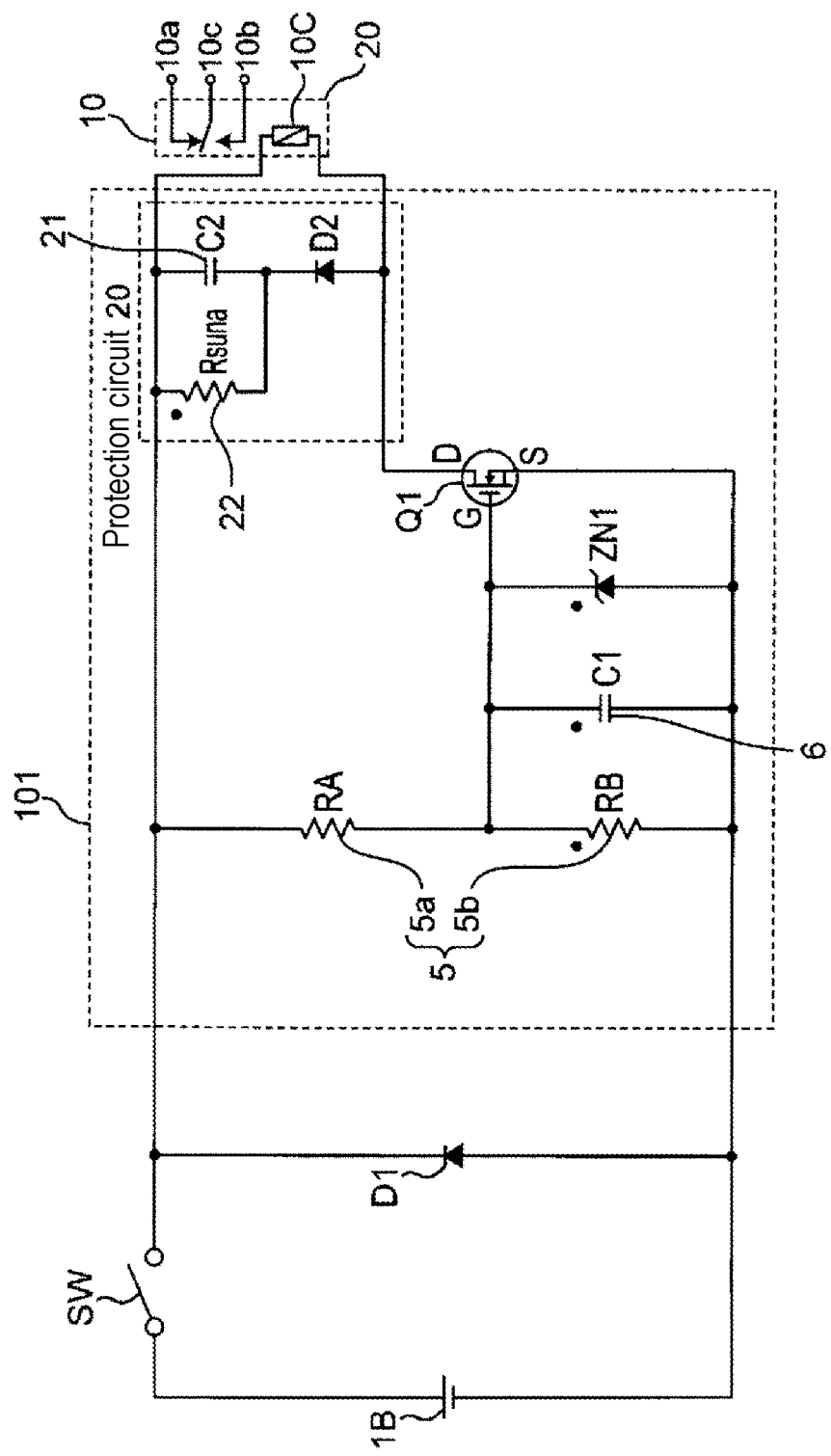
FIG. 1B is a circuit diagram illustrating a configuration example of the control circuit 101 and the peripheral circuit for the electromagnetic relay 10 according to a modification of the first embodiment of the present invention.

FIG. 1B is a circuit diagram illustrating a configuration example of the control circuit 101 and the peripheral circuit for the electromagnetic relay 10 according to a modification of the first embodiment of the present invention. In FIG. 1B, the modification of the first embodiment includes a diode D1 that is a surge absorbing element is provided instead of the diode bridge circuit 3 as compared with the first embodiment in FIG. 1A. The diode D1 is connected in parallel with the series circuit of the AC power source and the switch SW.

Second Embodiment

Figure 3:
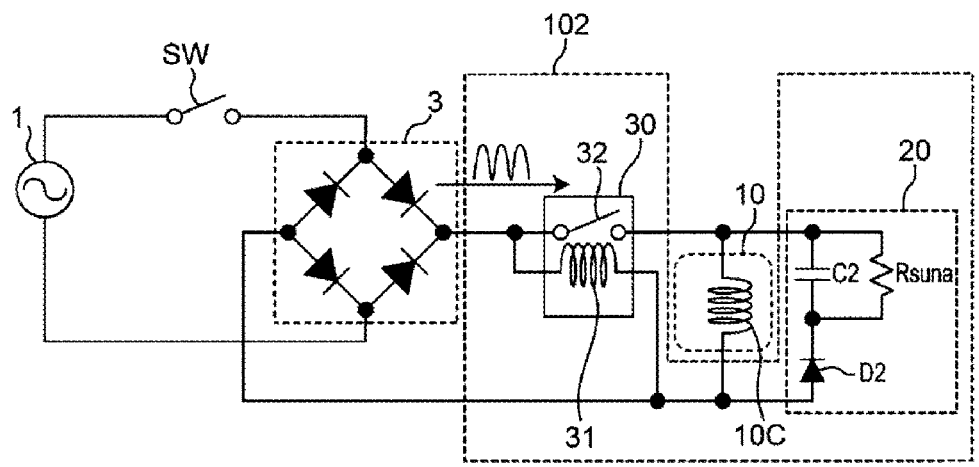
FIG. 3 is a circuit diagram illustrating a configuration example of a control circuit 102 and a peripheral circuit for an electromagnetic relay 10 according to a second embodiment of the present invention.

FIG. 3 is a circuit diagram illustrating a configuration example of a control circuit 102 and a peripheral circuit for an electromagnetic relay 10 according to a second embodiment of the present invention. Referring to FIG. 3, the control circuit 102 includes an electromagnetic relay 30 and a protection circuit 20. The electromagnetic relay 30 includes a contact switch 32 and a drive coil 31 that controls the contact switch 32. One of the features of the second embodiment is that the counter electromotive current decreasing electromagnetic relay 30 is inserted between a diode bridge circuit 3 and a drive coil 10C of the electromagnetic relay 10.

In FIG. 3, the AC voltage from the AC power source 1 is input to the diode bridge circuit 3 through a power switch SW. The diode bridge circuit 3 performs the full-wave rectification on the input AC voltage, the rectified AC voltage is applied to one end of the drive coil 10C of the electromagnetic relay 10 through the contact switch 32, and the diode bridge circuit 3 is grounded through the drive coil 31. The protection circuit 20 is connected in parallel with the drive coil 10C.

The diode bridge circuit 3 is provided in the control circuit 101 configured as described above, so that the problem of the return delay is generated in a movable contact 10c of the electromagnetic relay 10. However, in the control circuit 101, because the electromagnetic relay 30 is inserted between the diode bridge circuit 3 and the drive coil 10C of the electromagnetic relay 10, the contact switch 32 is turned off when the power switch SW is turned off. Thus, the attractive force of the drive coil 10C is also decreased at high speed by decreasing the current of the drive coil 10C at higher speed as compared with the conventional technique. Subsequently, the movable contact 10c of the electromagnetic relay 10 is switched from the fixed contact 10b to the fixed contact 10a, and turned off. Consequently, the movable contact 10c of the electromagnetic relay 10 can be returned at higher speed as compared with the conventional technique.

In the first embodiment, because the MOS transistor Q1 is used, it is necessary to smooth the full-wave rectified waveform of the output voltage of the diode bridge circuit 3 with a capacitor 6 or the like. However, when the electromagnetic relay 30 is inserted as in the second embodiment, a DC component of the full-wave rectified waveform can be extracted by inductance of the drive coil 31, so that necessity of the smoothing circuit component such as the capacitor 6 is eliminated. The same holds true for third to sixth embodiments (to be described later).

Third Embodiment

Figure 4:
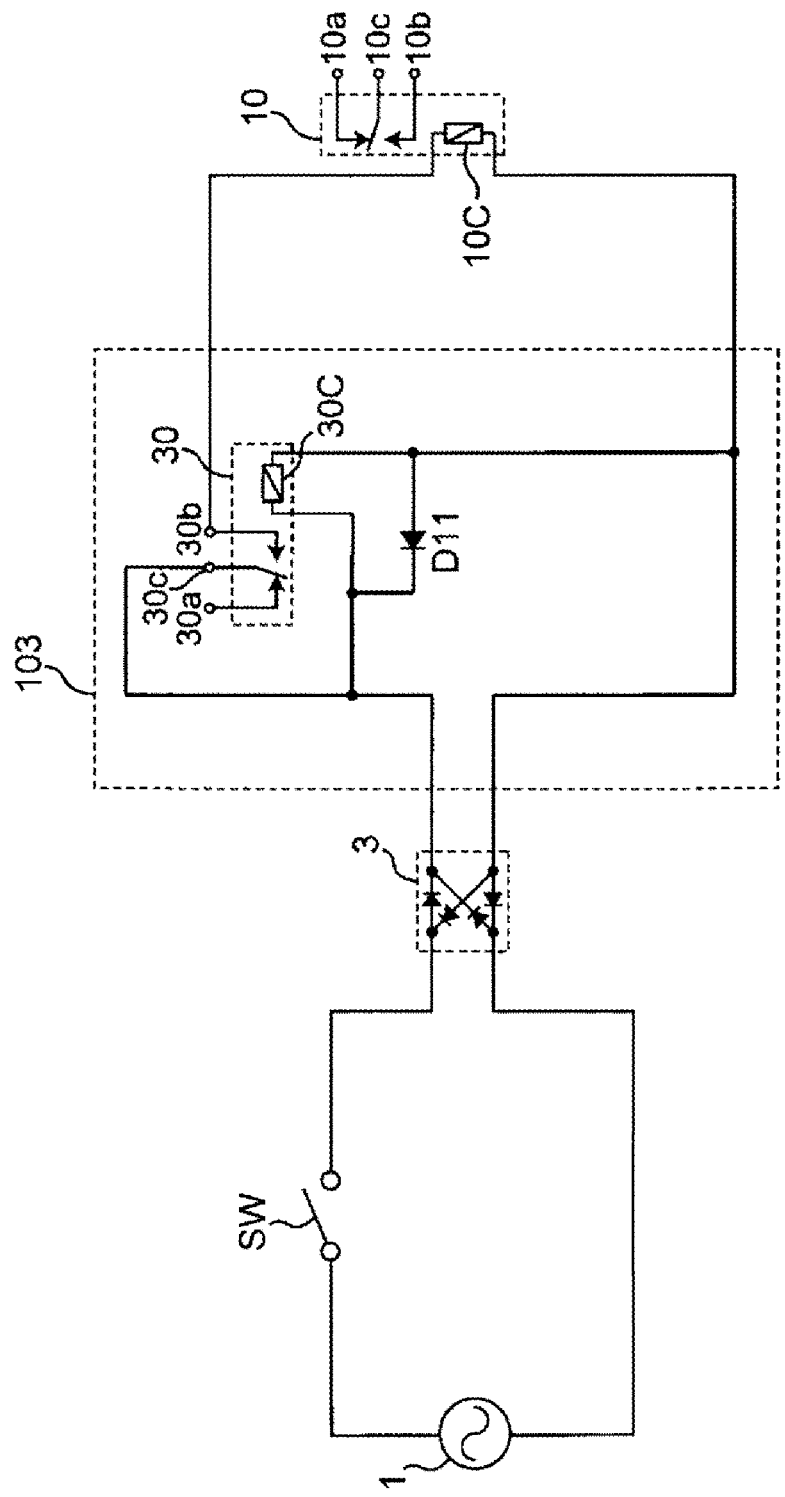
FIG. 4 is a circuit diagram illustrating a configuration example of a control circuit 103 and a peripheral circuit for an electromagnetic relay 10 according to a third embodiment of the present invention.

FIG. 4 is a circuit diagram illustrating a configuration example of a control circuit 103 and a peripheral circuit for an electromagnetic relay 10 according to a third embodiment of the present invention. Referring to FIG. 4, in the third embodiment, similarly to the second embodiment, an electromagnetic relay 30 is inserted between a diode bridge circuit 3 and the electromagnetic relay 10 in order to cut the back electromotive force during the return of the electromagnetic relay 10. However, the third embodiment is different from the second embodiment in FIG. 3 in the following point. That is, instead of the protection circuit 20, a surge absorbing diode D11 is connected to both ends of a drive coil 30C. In the third embodiment configured as described above, the same effects as those of the second embodiment are obtained.

Fourth Embodiment

Figure 5:
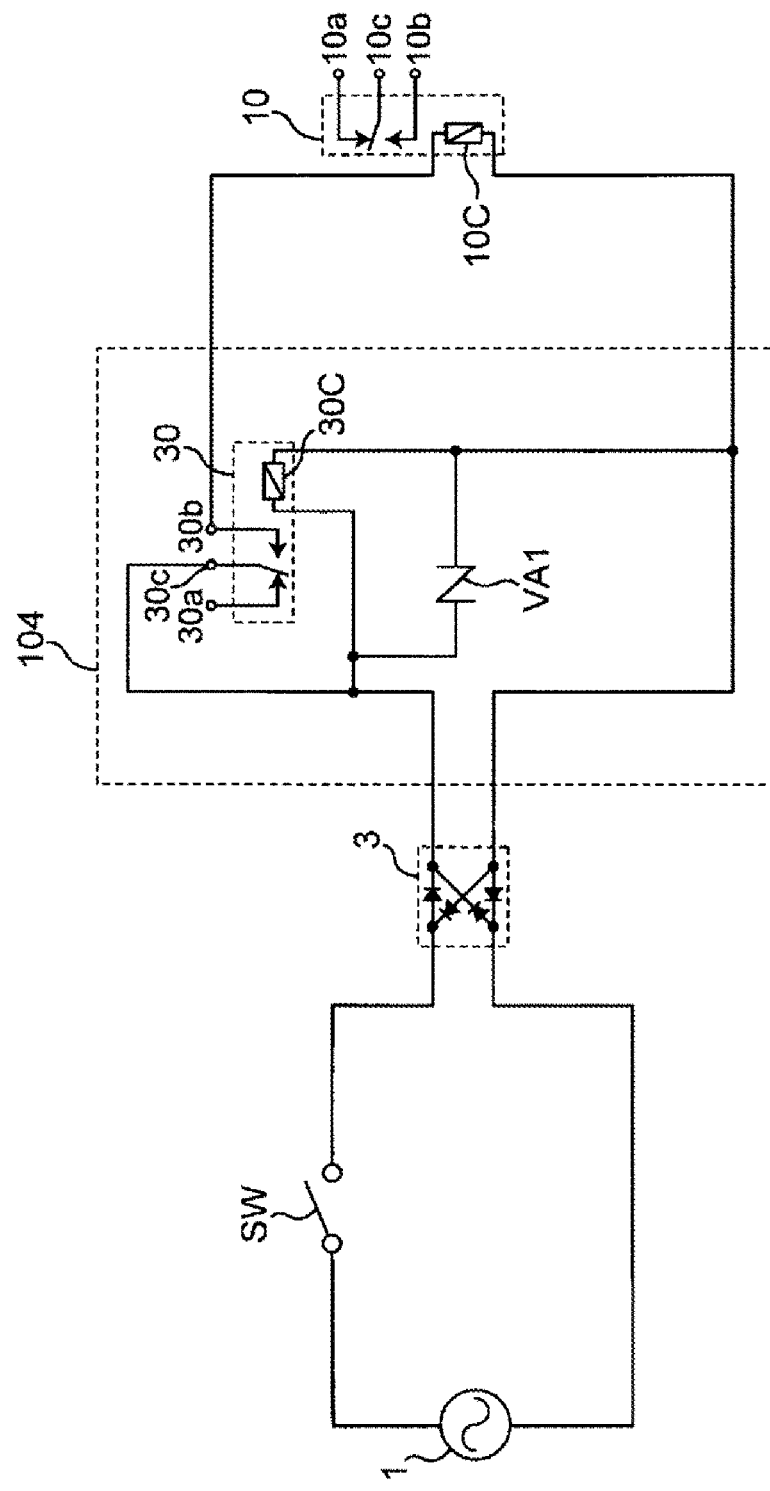
FIG. 5 is a circuit diagram illustrating a configuration example of a control circuit 104 and a peripheral circuit for an electromagnetic relay 10 according to a fourth embodiment of the present invention.

FIG. 5 is a circuit diagram illustrating a configuration example of a control circuit 104 and peripheral circuits for an electromagnetic relay 10 according to a fourth embodiment of the present invention. Referring to FIG. 5, in the fourth embodiment, similarly to the second embodiment, an electromagnetic relay 30 is inserted between a diode bridge circuit 3 and the electromagnetic relay 10 in order to cut the back electromotive force during the return of the electromagnetic relay 10. However, the fourth embodiment is different from the third embodiment in FIG. 4 in the following point. That is, a surge absorbing varistor VA1 is provided instead of the surge absorbing diode D11. In the fourth embodiment configured as described above, the same effects as those of the second and third embodiments are obtained.

Fifth Embodiment

Figure 6:
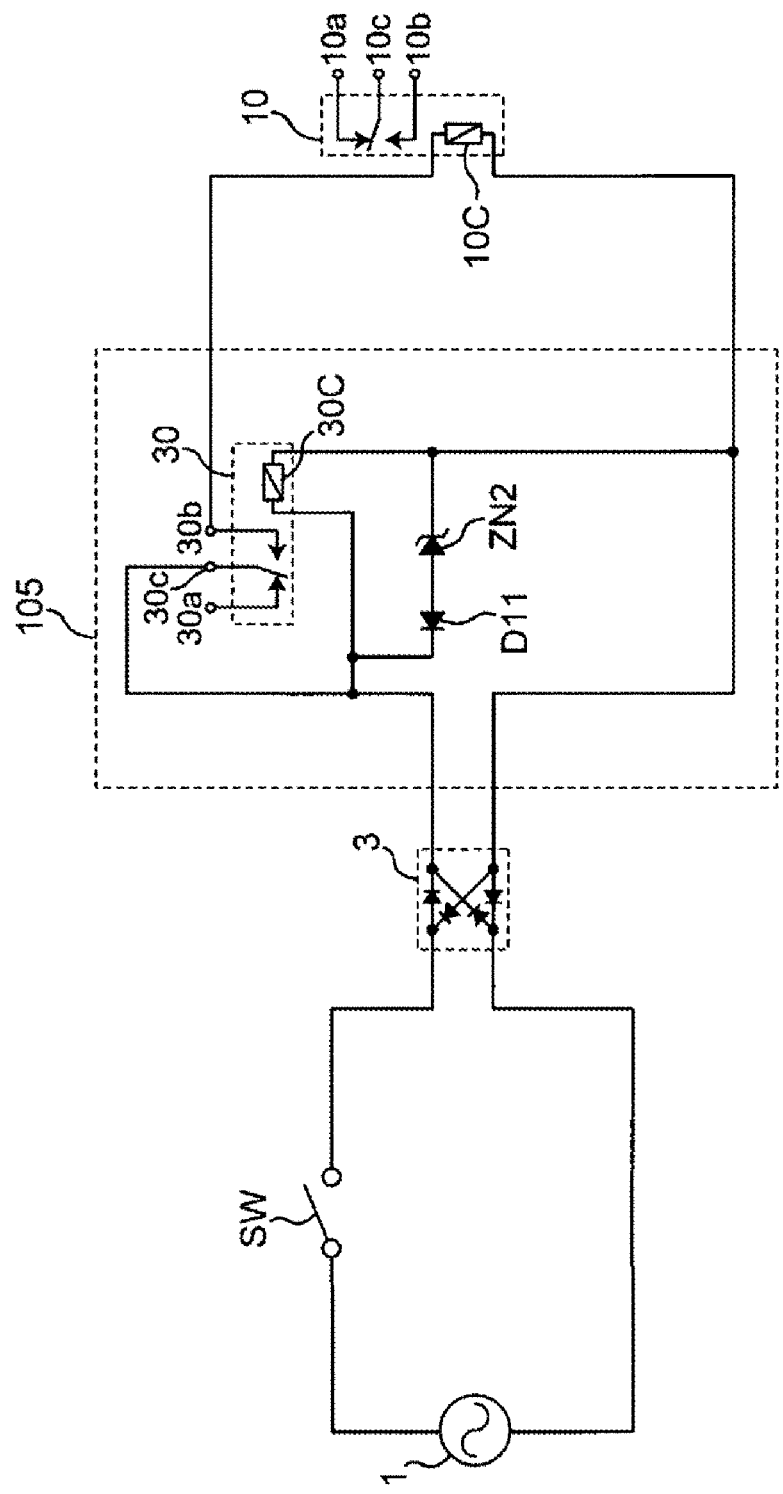
FIG. 6 is a circuit diagram illustrating a configuration example of a control circuit 105 and a peripheral circuit for an electromagnetic relay 10 according to a fifth embodiment of the present invention.

FIG. 6 is a circuit diagram illustrating a configuration example of a control circuit 105 and a peripheral circuit for an electromagnetic relay 10 according to a fifth embodiment of the present invention. Referring to FIG. 6, in the fifth embodiment, similarly to the second embodiment, an electromagnetic relay 30 is inserted between a diode bridge circuit 3 and the electromagnetic relay 10 in order to cut the back electromotive force during the return of the electromagnetic relay 10. However, the fifth embodiment is different from the third embodiment in FIG. 4 in the following point. That is, a surge absorbing circuit constructed with a series circuit of a diode D11 and a Zener diode ZN2 is provided instead of the surge absorbing diode D11. In the fifth embodiment configured as described above, the same effects as those of the second to fourth embodiments are obtained.

Sixth Embodiment

Figure 7:
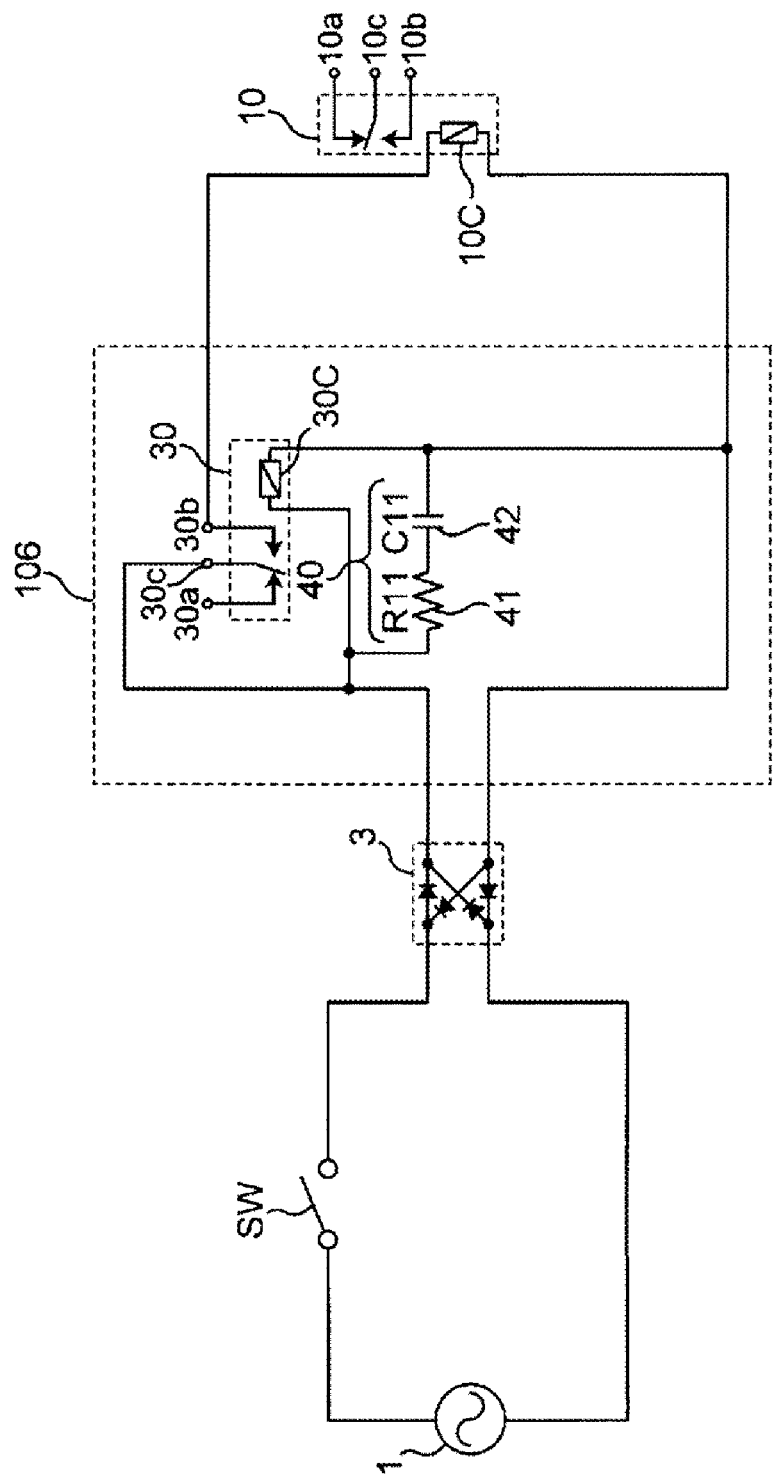
FIG. 7 is a circuit diagram illustrating a configuration example of a control circuit 106 and a peripheral circuit for an electromagnetic relay 10 according to a sixth embodiment of the present invention.
Figure 8:
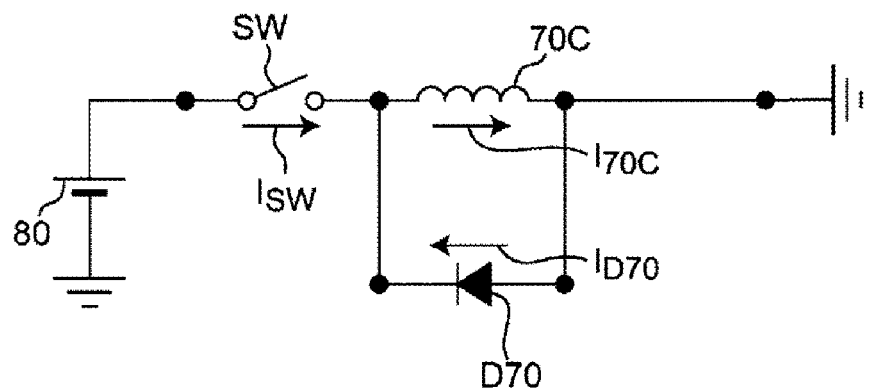
FIG. 8 is a circuit diagram illustrating a configuration example of a control circuit and a peripheral circuit for an electromagnetic relay according to a conventional example.
Figure 9:
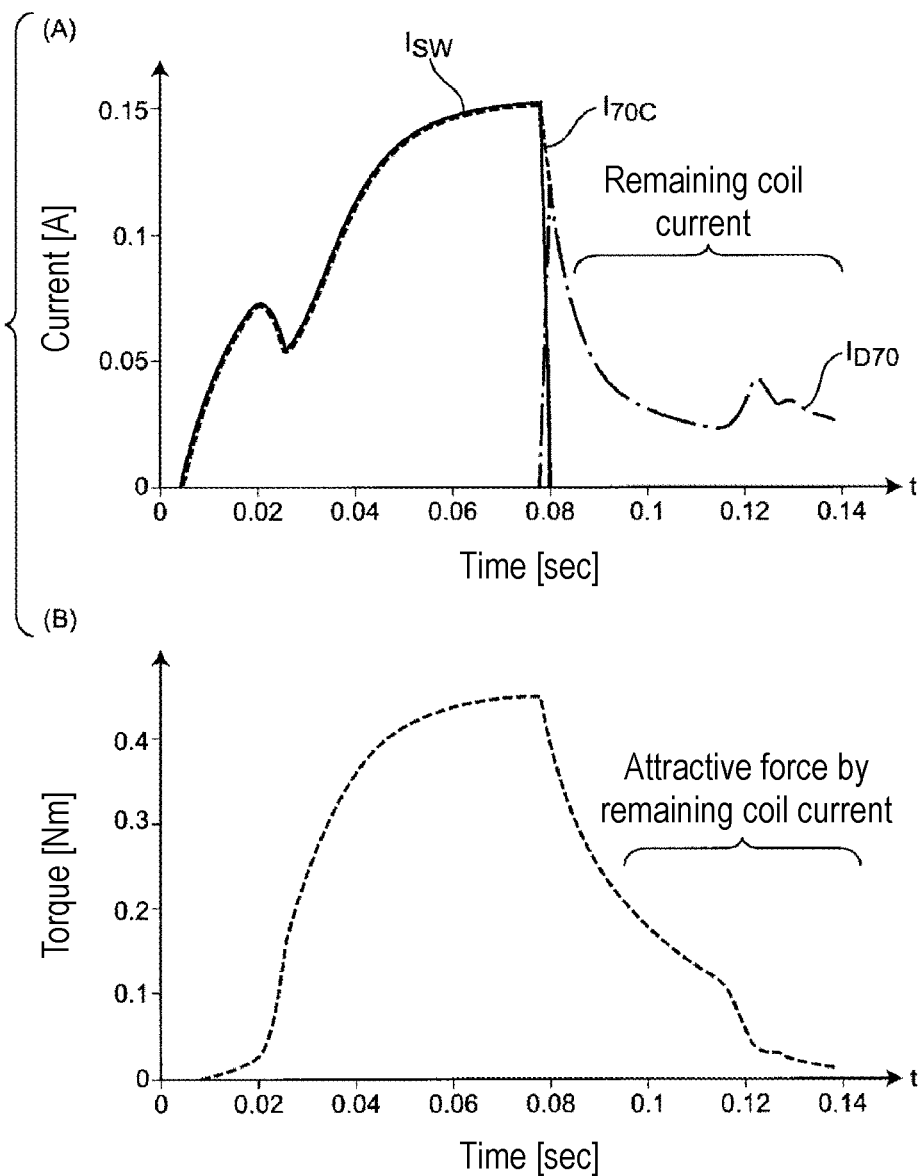
FIG. 9 is a graph illustrating operation of the control circuit in FIG. 8.

FIG. 7 is a circuit diagram illustrating a configuration example of a control circuit 106 and a peripheral circuit for an electromagnetic relay 10 according to a sixth embodiment of the present invention. Referring to FIG. 7, in the sixth embodiment, similarly to the second embodiment, an electromagnetic relay 30 is inserted between a diode bridge circuit 3 and the electromagnetic relay 10 in order to cut the back electromotive force during the return of the electromagnetic relay 10. However, the sixth embodiment is different from the third embodiment in FIG. 4 in the following point. That is, a surge absorbing CR circuit 40 constructed with a series circuit of a resistor 41 having a resistance value R11 and a capacitor 42 having a capacitance value C11 is provided instead of the surge absorbing diode D11. In the sixth embodiment configured as described above, the same effects as those of the second to fifth embodiments are obtained.

Modifications

In the embodiments, the surge absorbing element or circuit may include at least one of the diode, the snubber circuit, the varistor, the Zener diode, the CR circuit, and the resistor (a limiting resistor that decreases the surge voltage).

In the second to sixth embodiments, the diode bridge circuit 3 is provided. However, the present invention is not limited to the second to sixth embodiments. The diode D1 that is the surge absorbing element in FIG. 1B may be provided instead of the diode bridge circuit 3.

INDUSTRIAL APPLICABILITY

The control circuit of the present invention can be applied to an electromagnetic relay, for example, a switch device such as a power switch.

DESCRIPTION OF SYMBOLS

1 AC power source
2 capacitor
3 diode bridge circuit
5 voltage divider circuit
5a, 5b voltage divider resistor
6 capacitor
10 electromagnetic relay
10C drive coil
10a, 10b fixed contact
10c movable contact
20 protection circuit
21 capacitor
22 resistor
30 electromagnetic relay
30C drive coil
30a, 30b fixed contact
30c movable contact
31 drive coil
32 contact switch
40 CR circuit
41 resistor
42 capacitor
101, 102, 103, 104, 105, 106 control circuit
D1, D2, D11 diode
Q1 MOS transistor
SW power switch
VA1 varistor
ZN1, ZN2 Zener diode

The invention claimed is:

1. A control circuit for a switch device including a first switch element including a movable contact and a drive coil that controls the movable contact of the first switch element, the control circuit for returning the movable contact when the drive coil turns off the movable contact after the drive coil turns on the movable contact during supply of a source voltage from a power source, the control circuit comprising a second switch element inserted between a rectifier circuit or a surge absorbing element and the first switch element, the second switch element being turned off when the supply of the source voltage is turned off,
wherein the rectifier circuit or the surge absorbing element is connected between the power source and the control circuit, and
the movable contact is returned by turning off the second switch element to turn off the first switch element.

2. The control circuit according to claim 1, wherein the second switch element is a voltage control type switch element.

3. The control circuit according to claim 2, wherein the voltage control type switch element is a MOS transistor, a bipolar transistor, or an IGBT (Insulated Gate Bipolar Transistor).

4. The control circuit according to claim 3, further comprising a voltage divider circuit including two voltage divider resistors, the voltage divider circuit for dividing voltage of the power source to drive the second switch element using the divided voltages.

5. The control circuit according to claim 3, wherein the surge absorbing element includes at least one of a diode, a snubber circuit, a varistor, a Zener diode, a CR circuit, and a resistor.

6. The control circuit according to claim 2, further comprising a voltage divider circuit including two voltage divider resistors, the voltage divider circuit for dividing voltage of the power source to drive the second switch element using the divided voltages.

7. The control circuit according to claim 6, wherein the surge absorbing element includes at least one of a diode, a snubber circuit, a varistor, a Zener diode, a CR circuit, and a resistor.

8. The control circuit according to claim 2, wherein the surge absorbing element includes at least one of a diode, a snubber circuit, a varistor, a Zener diode, a CR circuit, and a resistor.

9. The control circuit according to claim 1, wherein the surge absorbing element includes at least one of a diode, a snubber circuit, a varistor, a Zener diode, a CR circuit, and a resistor.

10. A switch device comprising:
the control circuit according to claim 1; and
the first switch element.

11. The switch device according to claim 10, wherein the switch device is an electromagnetic relay or a switch.

12. A control circuit for a switch device including a first switch element including a movable contact and a drive coil that controls the movable contact of the first switch element, the control circuit for returning the movable contact when the drive coil turns off the movable contact after the drive coil turns on the movable contact during supply of a source voltage from a power source,
the control circuit comprising a second switch element inserted between the power source and the first switch element, the second switch element being turned off when the movable contact is turned off,
wherein the second switch element is driven by another drive coil, and
a surge absorbing element is connected to the drive coil or the other drive coil.

13. The control circuit according to claim 12, wherein the second switch element is an electromagnetic relay.

14. The control circuit according to claim 13, wherein the surge absorbing element includes at least one of a diode, a snubber circuit, a varistor, a Zener diode, a CR circuit, and a resistor.

15. The control circuit according to claim 12, wherein the surge absorbing element includes at least one of a diode, a snubber circuit, a varistor, a Zener diode, a CR circuit, and a resistor.

* * * * *